US011687697B2

(12) United States Patent
Wei et al.

(10) Patent No.: US 11,687,697 B2
(45) Date of Patent: Jun. 27, 2023

(54) METHOD AND SYSTEM FOR CORRECTING LITHOGRAPHY PROCESS HOTSPOTS BASED ON STRESS DAMPING ADJUSTMENT

(71) Applicant: Wuhan Yuwei Optical Software Co., Ltd., Hubei (CN)

(72) Inventors: Haiqing Wei, Hubei (CN); Shiyuan Liu, Hubei (CN); Hao Jiang, Hubei (CN)

(73) Assignee: Wuhan Yuwei Optical Software Co., Ltd., Hubei (CN)

( * ) Notice: Subject to any disclaimer, the term of this patent is extended or adjusted under 35 U.S.C. 154(b) by 57 days.

(21) Appl. No.: 17/564,241

(22) Filed: Dec. 29, 2021

(65) Prior Publication Data

US 2023/0046115 A1    Feb. 16, 2023

(30) Foreign Application Priority Data

Aug. 16, 2021   (CN) .......................... 202110936548.7

(51) Int. Cl.
*G06F 30/30* (2020.01)
*G03F 1/36* (2012.01)
*G03F 7/20* (2006.01)
*G06F 30/398* (2020.01)
*G03F 7/00* (2006.01)

(52) U.S. Cl.
CPC .............. *G06F 30/398* (2020.01); *G03F 1/36* (2013.01); *G03F 7/705* (2013.01); *G03F 7/7065* (2013.01)

(58) Field of Classification Search
None
See application file for complete search history.

(56) References Cited

U.S. PATENT DOCUMENTS

| 8,972,907 | B1 * | 3/2015 | Yokoyama | G06F 30/398 |
| | | | | 716/51 |
| 10,325,060 | B2 * | 6/2019 | Tan | G03F 1/36 |
| 10,445,461 | B2 * | 10/2019 | Zhang | G06F 30/398 |
| 2009/0007053 | A1 * | 1/2009 | Kim | G03F 1/36 |
| | | | | 716/53 |
| 2017/0053058 | A1 * | 2/2017 | Yu | G06F 30/398 |
| 2022/0317557 | A1 * | 10/2022 | Chen | G03F 1/36 |

FOREIGN PATENT DOCUMENTS

JP    2007164006 A  *  6/2007  ............... G03F 1/08

* cited by examiner

*Primary Examiner* — Leigh M Garbowski
(74) *Attorney, Agent, or Firm* — JCIPRNET

(57) ABSTRACT

A method and a system for correcting lithography process hotspots based on stress damping adjustment are provided. The method includes: acquiring a mark hotspot of a mask pattern; forming N annuli centered on the mark hotspot from inner to outer on a mask; moving vertexes of the mask pattern located in each annulus by a specific distance in a direction deviating from the mark hotspot and connecting the moved vertexes according to an original connection relationship to acquire an updated layout; verifying electrical characteristics of the updated layout, determining whether a deviation of the electrical characteristics of the updated layout is within a tolerable range, and performing geometric correction to compensate for a deviation of electrical parameters if no is determined and then ending correction, or ending the correction if yes is determined.

10 Claims, 4 Drawing Sheets

METHOD AND SYSTEM FOR CORRECTING LITHOGRAPHY PROCESS HOTSPOTS BASED ON STRESS DAMPING ADJUSTMENT

CROSS-REFERENCE TO RELATED APPLICATION

This application claims the priority benefit of China Application No. 202110936548.7, filed on Aug. 16, 2021. The entirety of the above-mentioned patent application is hereby incorporated by reference herein and made a part of this specification.

BACKGROUND

Technical Field

The disclosure belongs to the technical field of semiconductor manufacturing, and more specifically, relates to a method and system for correcting lithography process hotspots based on stress damping adjustment.

Description of Related Art

Semiconductor integrated circuits (ICs) are the core of the electronic information industry. With the rapid development of the Internet industry, the integrated circuits become increasingly important. Lithography is one of the core technologies of large-scale integrated circuit manufacturing, and the task of lithography is to transfer the mask pattern to the photoresist coated on the silicon wafer. Lithography represents the advanced level of the manufacturing process because it directly determines the smallest pattern size that can be manufactured, which in turn determines the performance of the integrated circuit.

With the continuous reduction of technology nodes, when the critical dimension of the lithography pattern reaches below the wavelength of the adopted illumination light source, the optical proximity effect (OPE) occurs in the lithography imaging system, which causes the exposure pattern formed on the silicon wafer to exhibit a certain distortion compared with the adopted mask pattern. Therefore, it is necessary to optimize the design of the mask pattern in advance and to perform optical proximity correction (OPC), so as to allow the exposure pattern acquired on the silicon wafer to be more similar to the target pattern.

In the actual sub-wavelength lithography process, since the design CD value is much smaller than the wavelength, after the OPC layout is corrected, excessive OPC correction may decrease the spacing between the mask patterns, resulting in defects such as pinches and bridges in the exposure pattern on the actual silicon wafer. These defective areas are referred to as lithography process hotspot areas, or lithography process hotspots or hotspots for short. The lithography process hotspots may affect the circuit performance of the device, and may even cause the actual circuit function to be completely changed, leading to the failure of integrated circuit tapeout.

SUMMARY

Regarding the abovementioned defects or the requirement for improvement, the disclosure provides a method and a system for correcting lithography process hotspots based on stress damping adjustment capable of eliminating hotspots on a mask pattern, so as to solve the technical problem of defects such as pinches and bridges generated on an exposure pattern on an actual silicon wafer caused by presence of the hotspots on the mask pattern.

To achieve the above, an embodiment of the disclosure provides a method for correcting lithography process hotspots based on stress damping adjustment. The method includes the following steps.

In step 1, a mark hotspot of a mask pattern is acquired.

In step 2, N concentric closed patterns centered on the mark hotspot are formed, and the N concentric closed patterns form N annuli with gradually increasing numbers of rings from inner to outer on a mask.

In step S3, vertexes of the mask pattern located in each annulus are moved by a specific distance in a direction deviating from the mark hotspot, and the moved vertexes are connected according to an original connection relationship to acquire an updated layout. A moving distance of each vertex decreases as the number of rings of each annulus increases, and the specific distance does not exceed a tolerable deviation of a layout electrical design.

In step 4, electrical characteristics of the updated layout are verified, it is determined whether a deviation of the electrical characteristics of the updated layout is within a tolerable range, and geometric correction is performed to compensate for a deviation of electrical parameters if no is determined and correction is then ended, or the correction is ended if yes is determined.

Preferably, each of the concentric closed patterns is one of a circle, a rectangle, or a regular polygon.

Preferably, the specific distance of moving the vertexes in a $k^{th}$ annulus is $d_k=(N-k)*\varepsilon$, where $\varepsilon$ is a predetermined moving step length.

Preferably, the step of moving the vertexes of the mask pattern located in each annulus by the specific distance in the direction deviating from the mark hotspot further includes the following step. Each vertex is moved individually, or a line segment containing the vertexes in the annulus is moved as a whole.

Preferably, each of the concentric closed patterns is a circle, and each of the annuli is a circular ring. The step of moving the vertexes by the specific distance in the direction deviating from the mark hotspot further includes the following step. Each vertex is moved by the specific distance in a direction from the mark hotspot to the vertex.

Preferably, each of the concentric closed patterns is a rectangular, and each of the annuli is a rectangular ring. The step of moving the vertexes by the specific distance in the direction deviating from the mark hotspot further includes the following step. Each vertex is moved by the specific distance in a direction perpendicular to a nearest rectangle side.

Preferably, when the mask pattern in the annuli contains arc-shaped lines, the arc-shaped lines are divided into step-shaped line segments, and the vertexes of the step-shaped line segments are moved.

Preferably, the mask pattern includes a plurality of discontinuous sub-patterns, and when the mark hotspot is located on any of the sub-patterns, the vertexes on the other sub-patterns except the sub-pattern where the mark hotspot is located are selected and moved.

Preferably, when a plurality of hotspots are acquired on the mask, each hotspot corresponds to one hotspot area, one of the hotspots is selected to act as the mark hotspot, all overlapping areas between two hotspots are determined, and vertexes outside the overlapping areas are selected and moved.

An embodiment of the disclosure further provides a system for correcting lithography process hotspots based on stress damping adjustment. The system includes a hotspot acquisition unit, an area segmentation unit, a moving unit, and a verification unit.

The hotspot acquisition unit is configured for acquiring a mark hotspot of a mask pattern.

The area segmentation unit is configured for forming N concentric closed patterns centered on the mark hotspot, and the N concentric closed patterns form N annuli with gradually increasing numbers of rings from inner to outer on a mask.

The moving unit is configured for moving vertexes of the mask pattern located in each annulus by a specific distance in a direction deviating from the mark hotspot and connecting the moved vertexes according to an original connection relationship to acquire an updated layout. A moving distance of each vertex decreases as the number of rings of each annulus increases, and the specific distance does not exceed a tolerable deviation of a layout electrical design.

The verification unit is configured for verifying electrical characteristics of the updated layout, determining whether a deviation of the electrical characteristics of the updated layout is within a tolerable range, and performing geometric correction to compensate for a deviation of electrical parameters if no is determined and then ending correction, or ending the correction if yes is determined.

To sum up, compared with the related art, in the technical solution provided by disclosure, the mark hotspot is located and the layout area centered on the mark hotspot is divided into a plurality of annuli. By moving the vertexes of the mask pattern in the annuli, the spacings of the mask pattern in the hotspot areas are increased, that is, by adjusting the stress damping of the layout, the hotspots are thereby eliminated without changing the overall electrical characteristics of the mask pattern. In the disclosure, only the local layout near each hotspot is modified for repair, and physical design tools such as changing placement and routing (usually including RC extraction and timing analysis) are not required to be used. In this way, the required workload is significantly reduced, and the efficiency of hotspot repair is improved.

DESCRIPTION OF THE EMBODIMENTS

To better illustrate the goal, technical solutions, and advantages of the disclosure, the following embodiments accompanied with drawings are provided such that the disclosure are further described in detail. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

Figure 1:
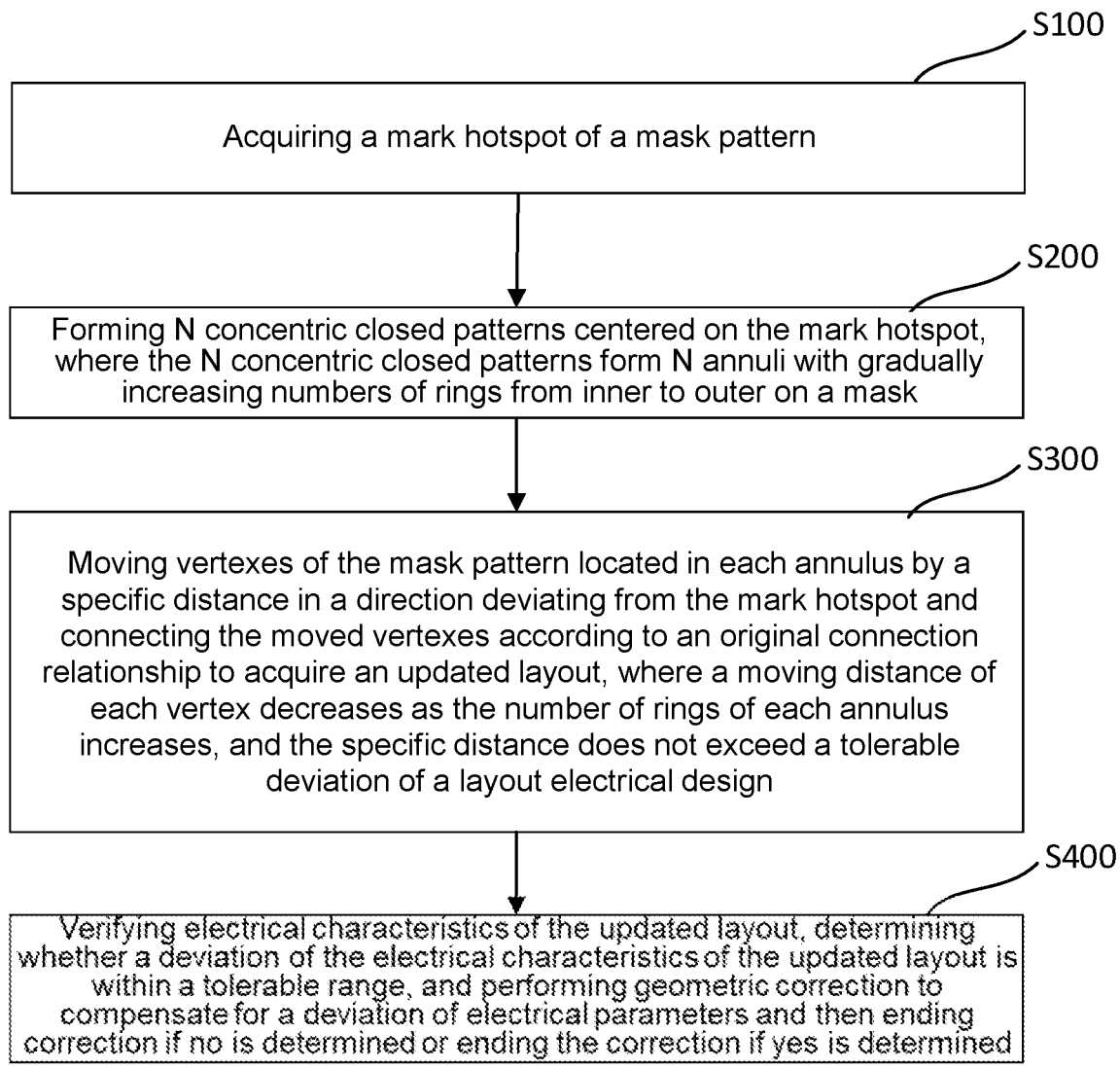
FIG. 1 is a flow chart of steps of a method for correcting lithography process hotspots based on stress damping adjustment according to an embodiment of the disclosure.

FIG. 1 is a flow chart of steps of a method for correcting lithography process hotspots based on stress damping adjustment according to an embodiment of the disclosure, and the method includes the following steps.

Step S100: a mark hotspot of a mask pattern is acquired.

Step S200: N concentric closed patterns centered on the mark hotspot are formed, and the N concentric closed patterns form N annuli with gradually increasing numbers of rings from inner to outer on a mask.

Step S300: vertexes of the mask pattern located in each annulus are moved by a specific distance in a direction deviating from the mark hotspot, and the moved vertexes are connected according to an original connection relationship to acquire an updated layout. A moving distance of each vertex decrease as the number of rings of each annulus increases, and the specific distance does not exceed a tolerable deviation of a layout electrical design.

Step S400: electrical characteristics of the updated layout are verified, it is determined whether a deviation of the electrical characteristics of the updated layout is within a tolerable range, and geometric correction is performed to compensate for a deviation of electrical parameters if no is determined and correction is then ended, or the correction is ended if yes is determined.

Details of each step are explained hereinafter.

Regarding step S100, a mark hotspot of a mask pattern is acquired.

In an embodiment, auxiliary software may be used to automatically detect a hotspot of the mask pattern. The auxiliary software may detect a hotspot area, and the hotspot is located in a center of the hotspot area. In an embodiment, when a plurality of hotspots are provided, one of the hotspots is selected as a mark hotspot.

Figure 3:
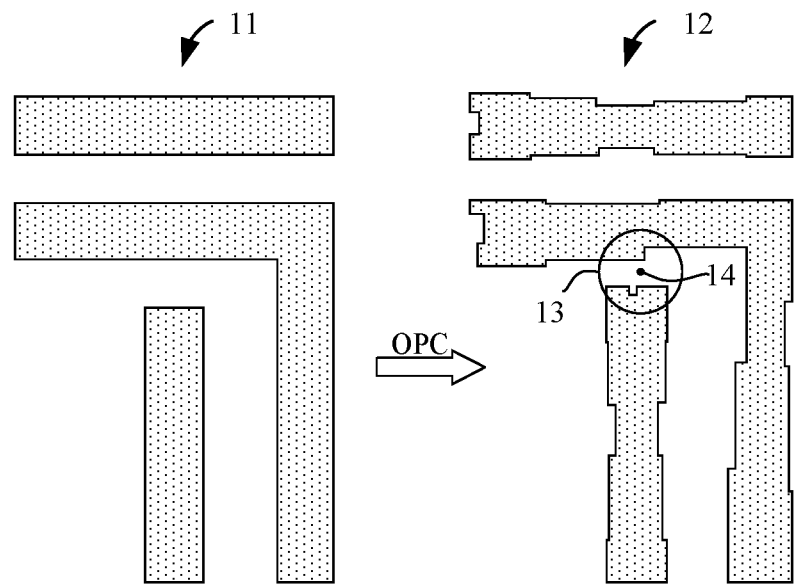
FIG. 3 is a schematic diagram of a mask pattern and a mark hotspot area according to an embodiment of the disclosure.

In an embodiment, the mask pattern is a mask pattern verified by optical proximity correction (OPC) and photolithography. As shown in FIG. 3, a pattern to be formed 11 is verified by OPC and photolithography to acquire a mask pattern 12, that is, a design pattern, where the pattern to be formed is the pattern that needs to be formed on a silicon wafer. It should be noted that only a portion of the pattern is shown in the figure. In the mask pattern 12, a distance between line edges is obviously narrowed in the portion marked by a circle, a bridging defect may thereby occur, and circuit performance may thus be affected. Therefore, the mask pattern 12 may not be directly used as a mask, and the mask pattern 12 needs to be repaired. In this embodiment, the area enclosed by the circle is the a mark hotspot area 13, and a center point thereof is a mark hotspot 14.

Regarding step S200: N concentric closed patterns centered on the mark hotspot are formed, and the N concentric closed patterns form N annuli with gradually increasing numbers of rings from inner to outer on a mask.

In an embodiment, shapes of the N concentric closed patterns are the same. In an embodiment, each of the concentric closed patterns may one of a circle, a rectangle, or a regular polygon. In an embodiment, widths of the annuli are the same, and the widths may be denoted as W.

Figure 4:
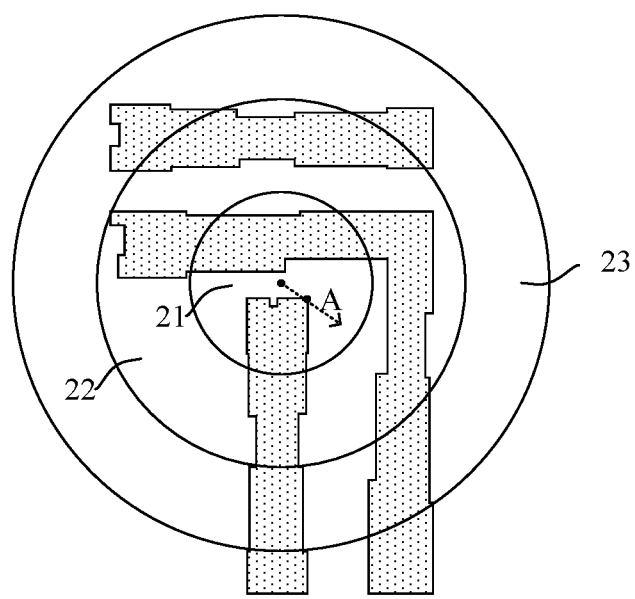
FIG. 4 is a schematic diagram of circular division of a local area around the mark hotspot according to an embodiment of the disclosure.

In an embodiment, each of the concentric closed patterns is a circle, and each of the annuli is a circular ring. As shown in FIG. 4, the mark hotspot (not shown) is treated as a center of circles, a plurality of circular rings are formed, and the innermost circle may be treated as a circular ring with an inner diameter of 0. The mark hotspot may be treated as an origin to establish a two-dimensional coordinate system. Coordinates of each point on the mask are expressed as (x, y), then a $k^{th}$ annulus (0≤k<N) may be defined as $kW \leq (x^2+y^2)^{1/2} < (k+1)$, where W is the width of each annulus, R is a radius of a circular area divided into N annuli, and R=NW. FIG. 4 depicts a circular ring 21, a circular ring 22, and a circular ring 23 from the inside and to the outside. It should be noted that FIG. 4 is merely a partial schematic diagram, not an overall diagram.

Figure 5:
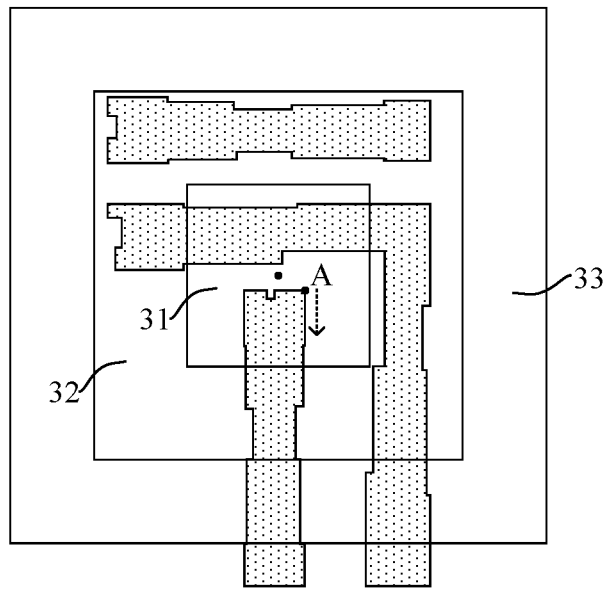
FIG. 5 is a schematic diagram of square division of the local area around the mark hotspot according to an embodiment of the disclosure.

In an embodiment, each of the concentric closed patterns is a square, and each of the annuli is a square ring. As shown in FIG. 5, the mark hotspot (not shown) is treated as a center of squares, a plurality of square rings are formed, and the innermost square may be treated as a square ring with an inner diameter of 0. The mark hotspot may be treated as the origin to establish a two-dimensional coordinate system. The coordinates of each point on the mask are expressed as (x, y), then a $k^{th}$ annulus (0≤k<N) may be defined as $kW \leq |x| < (k+1)W$ and $kW \leq |y| < (k+1)W$, where W is the width of each annulus, R is half of a side length of a square area divided into N square rings, and R=NW. FIG. 5 depicts a square ring 31, a square ring 32, and a square ring 33 from the inside and to the outside. It should be noted that FIG. 5 is merely a partial schematic diagram, not an overall diagram.

In this embodiment, W=100 nm, N=100, and R=10 um.

Regarding step S300, vertexes of the mask pattern located in each annulus are moved by a specific distance in a direction deviating from the mark hotspot, and the moved vertexes are connected according to an original connection relationship to acquire an updated layout. A moving distance of each vertex decrease as the number of rings of each annulus increases, and the specific distance does not exceed a tolerable deviation of a layout electrical design.

Herein, the tolerable deviation of the layout electrical design is a value calculated in advance.

In an embodiment, the vertexes of the mask pattern located in each annulus are moved in a direction deviating from the mark hotspot. The specific moving direction may be flexibly configured according to the actual situation, as long as a line spacing in the original hotspot area increases after the movement.

In an embodiment, when the vertexes of the mask pattern located in each annulus are moved by a specific distance in the direction deviating from the mark hotspot, each vertex is moved individually.

As shown in FIG. 4, the annuli are circular rings, and each annulus has a plurality of vertexes. Each vertex is moved individually, and then the vertexes are connected into a pattern according to an original connection feature. When the vertexes are moved by the specific distance in the direction deviating from the mark hotspot, each vertex is specifically moved by the specific distance in a direction from the mark hotspot to the vertex (radial direction). With reference to FIG. 4 again, the moving direction of a vertex A is the direction from the mark hotspot to the vertex A, that is, the direction of the dotted arrow in FIG. 4.

As shown in FIG. 5, the annuli are square rings, and each annulus has a plurality of vertexes. Each vertex is moved individually, and then the vertexes are connected into a pattern according to the original connection feature. When the vertexes are moved by the specific distance in the direction deviating from the mark hotspot, each vertex is moved by the specific distance in a direction perpendicular to a nearest rectangle side. With reference to FIG. 5 again, the moving direction of the vertex A is a vertical downward direction in the figure, that is, the direction of the dotted arrow in FIG. 5.

In an embodiment, when the vertexes of the mask pattern located in each annulus are moved by the specific distance in the direction deviating from the mark hotspot, a line segment containing the vertexes in the annulus is moved as a whole. That is, regardless of whether the line segment is completely within one annulus or one or both ends of the line segment are cut off by a boundary line of the annulus, the entire (sub-) segment within the annulus is displaced as a whole under any circumstance.

In an embodiment, the specific distance of moving the vertexes in the $k^{th}$ annuli is $d_k = (N-k)*\varepsilon$, where $\varepsilon$ is a is a small positive number and is determined according to the actual situation. In a specific embodiment, $\varepsilon$=1 nm.

In an embodiment, the mask pattern includes a plurality of discontinuous sub-patterns, that is, the mask pattern includes a plurality of unconnected sub-patterns. When the mark hotspot is located on any of the sub-patterns, the vertexes of the sub-pattern where the mark hotspot is located is not moved, and the vertexes on the other sub-patterns except the sub-pattern where the mark hotspot is located are selected and moved.

In an embodiment, when a plurality of hotspots are acquired on the mask, each hotspot corresponds to one hotspot area, one of the hotspots is selected to act as the mark hotspot, all overlapping areas between two hotspots are determined, the vertexes inside the overlapping areas are not moved, and vertexes outside the overlapping areas are selected and moved.

Figure 6:
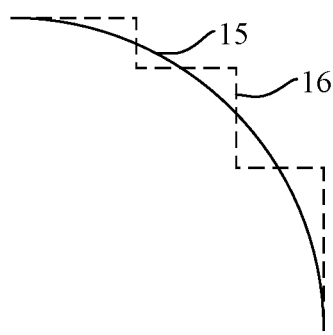
FIG. 6 is a schematic diagram of segmentation of an arc-shaped line segment according to an embodiment of the disclosure.

In an embodiment, as shown in FIG. 6, in the case that the mask pattern in the annuli includes lines with inconspicuous angles, and no obvious polygon vertexes are found, these "irregular" line segments may be divided into a combination of a series of line segments with specific angles. For instance, an arc-shaped line 15 is changed to a combination of horizontal and vertical lines to form a step-shaped line segment 16, and the step-shaped line segment 16 is to be moved.

In step S400, electrical characteristics of the updated layout which is acquired through the foregoing steps are verified, it is determined whether a deviation of the electrical characteristics of the updated layout is within a tolerable range, and geometric correction is performed to compensate for a deviation of electrical parameters if no is determined and correction is then ended, or the correction is ended if yes is determined.

In an embodiment, a RC extraction tool is used to verify the electrical characteristics of the updated layout pattern, and it is determined whether the deviation of the electrical characteristics of the updated layout is within the tolerable range. For instance, regarding whether the deviation is within the tolerance range, if a change in electrical characteristics exceeds the tolerance range, an error which is caused is required be corrected. Under the guiding provided by the RC extraction tool, further geometric modifications may be made after stress damping. For instance, a dimension may be fine-tuned, or a dense zigzag line may be adjusted to a smooth line to compensate for the deviation of electrical parameters, until the final stress damping and the modified layout are equal to the original layout.

Figure 2:
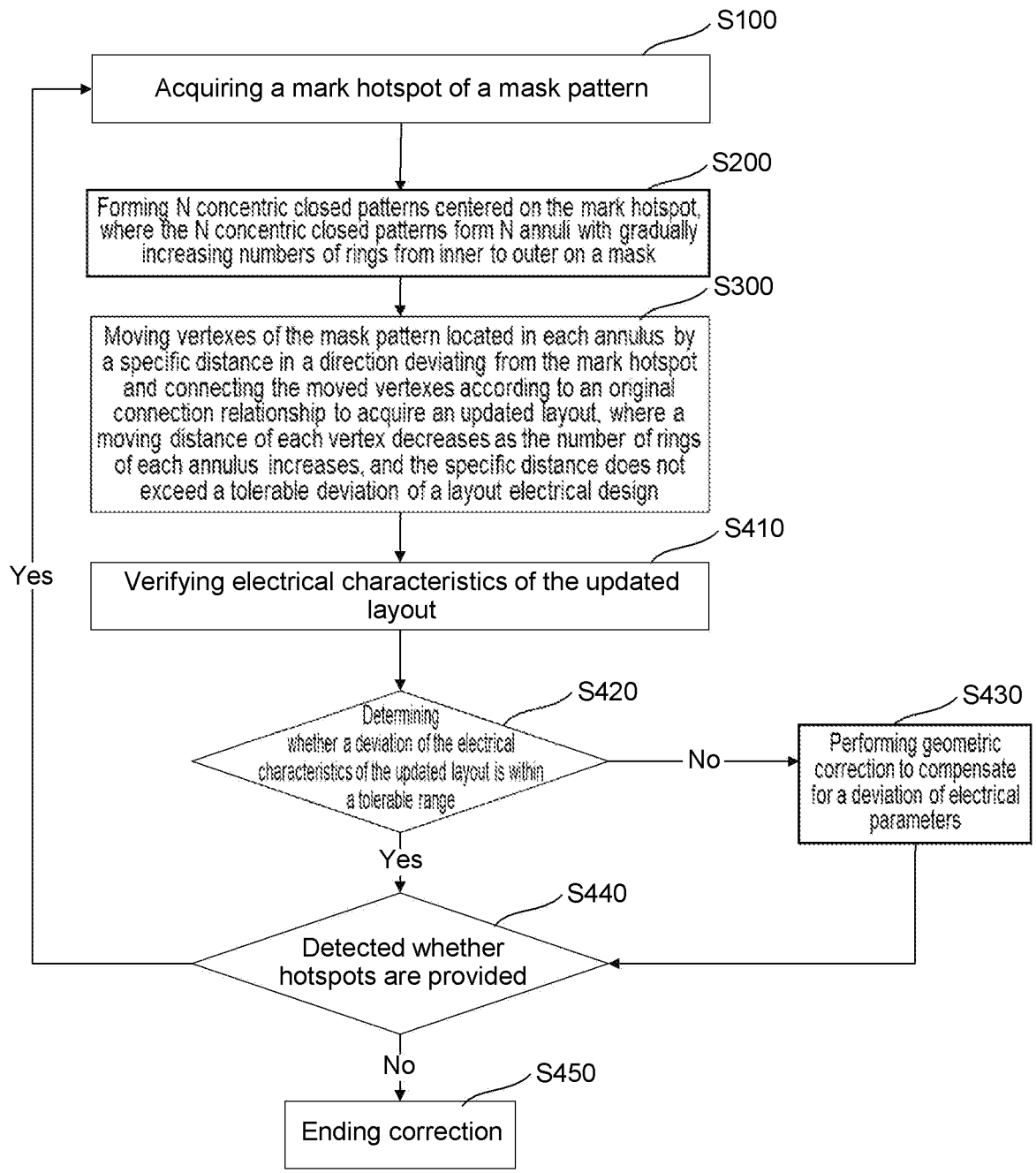
FIG. 2 is a flow chart of steps of a method for correcting lithography process hotspots based on stress damping adjustment according to another embodiment of the disclosure.

In an embodiment, as shown in FIG. 2, step S400 may specifically includes the following sub-steps.

Step S410: the electrical characteristics of the updated layout are verified.

Step S420: it is determined whether a deviation of the electrical characteristics of the updated layout is within a tolerable range, step S430 is performed next if no is determined, and step S440 is performed instead if yes is determined.

Step S430: geometric correction is performed to compensate for a deviation of electrical parameters.

Step S440: it is continuously detected whether hotspots are provided, step S100 is performed next if yes is determined, and step S450 is performed instead if no is detected.

Step S450: correction ends.

In this embodiment, by setting a loop process, the layout is repeatedly optimized to completely eliminate the hotspots.

In the disclosure, the mark hotspot is located and the layout area centered on the mark hotspot is divided into a plurality of annuli. By moving the vertexes of the mask pattern in the annuli, the spacings of the mask pattern in the hotspot areas are increased, the hotspots are thereby eliminated without changing the overall electrical characteristics of the mask pattern. In the disclosure, only the local layout near each hotspot is modified for repair, and physical design tools such as changing placement and routing (usually including RC extraction and timing analysis) are not required to be used. In this way, the required workload is significantly reduced, and the efficiency of hotspot repair is improved.

The disclosure further includes a system for correcting lithography process hotspots based on stress damping adjustment. The system includes a hotspot acquisition unit, an area segmentation unit, a moving unit, and a verification unit.

The hotspot acquisition unit is configure for acquiring a mark hotspot of a mask pattern.

The area segmentation unit is configured for forming N concentric closed patterns centered on the mark hotspot, and the N concentric closed patterns form N annuli with gradually increasing numbers of rings from inner to outer on a mask.

The moving unit is configured for moving vertexes of the mask pattern located in each annulus by a specific distance in a direction deviating from the mark hotspot and connecting the moved vertexes according to an original connection relationship to acquire an updated layout. A moving distance of each vertex decreases as the number of rings of each annulus increases, and the specific distance does not exceed a tolerable deviation of a layout electrical design.

The verification unit is configured for verifying electrical characteristics of the updated layout, determining whether a deviation of the electrical characteristics of the updated layout is within a tolerable range, and performing geometric correction to compensate for a deviation of electrical parameters if no is determined and then ending correction, or ending the correction if yes is determined.

To be specific, the functions of the units in the system correspond to the method for correcting lithography process hotspots one-to-one, and description thereof is not repeated herein.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A method for correcting lithography process hotspots based on stress damping adjustment, comprising:

step 1: acquiring a mark hotspot of a mask pattern;

step 2: forming N concentric closed patterns centered on the mark hotspot, wherein the N concentric closed patterns form N annuli with gradually increasing numbers of rings from inner to outer on a mask;

step 3: moving vertexes of the mask pattern located in each annulus by a specific distance in a direction deviating from the mark hotspot and connecting the moved vertexes according to an original connection relationship to acquire an updated layout, wherein a moving distance of each vertex decreases as the number of rings of each annulus increases, and the specific distance does not exceed a tolerable deviation of a layout electrical design; and step 4: verifying electrical characteristics of the updated layout, determining whether a deviation of the electrical characteristics of the updated layout is within a tolerable range, and performing geometric correction to compensate for a deviation of electrical parameters if no is determined and then ending correction, or ending the correction if yes is determined.

2. The method for correcting the lithography process hotspots according to claim 1, wherein each of the concentric closed patterns is one of a circle, a rectangle, or a regular polygon.

3. The method for correcting the lithography process hotspots according to claim 1, wherein the specific distance of moving the vertexes in a $k^{th}$ annulus is $d_k=(N-k)*\varepsilon$, where $\varepsilon$ is a predetermined moving step length.

4. The method for correcting the lithography process hotspots according to claim 1, wherein the step of moving the vertexes of the mask pattern located in each annulus by the specific distance in the direction deviating from the mark hotspot further comprises the following step: moving each vertex individually or moving a line segment containing the vertexes in the annulus as a whole.

5. The method for correcting the lithography process hotspots according to claim 1, wherein each of the concentric closed patterns is a circle, each of the annuli is a circular ring, and the step of moving the vertexes by the specific distance in the direction deviating from the mark hotspot further comprises the following step: moving each vertex by the specific distance in a direction from the mark hotspot to the vertex.

6. The method for correcting the lithography process hotspots according to claim 1, wherein each of the concentric closed patterns is a rectangular, each of the annuli is a rectangular ring, and the step of moving the vertexes by the specific distance in the direction deviating from the mark hotspot further comprises the following step: moving each vertex by the specific distance in a direction perpendicular to a nearest rectangle side.

7. The method for correcting the lithography process hotspots according to claim 1, wherein when the mask pattern in the annuli contains arc-shaped lines, the arc-shaped lines are divided into step-shaped line segments, and the vertexes of the step-shaped line segments are moved.

8. The method for correcting the lithography process hotspots according to claim 1, wherein the mask pattern comprises a plurality of discontinuous sub-patterns, and when the mark hotspot is located on any of the sub-patterns, the vertexes on the other sub-patterns except the sub-pattern where the mark hotspot is located are selected and moved.

9. The method for correcting the lithography process hotspots according to claim 1, wherein when a plurality of hotspots are acquired on the mask, each hotspot corresponds to one hotspot area, one of the hotspots is selected to act as the mark hotspot, all overlapping areas between two hotspots are determined, and vertexes outside the overlapping areas are selected and moved.

10. A system for correcting lithography process hotspots based on stress damping adjustment, comprising:

a hotspot acquisition unit, configure to acquire a mark hotspot of a mask pattern;

an area segmentation unit, configured for forming N concentric closed patterns centered on the mark hotspot, wherein the N concentric closed patterns form N annuli with gradually increasing numbers of rings from inner to outer on a mask;

a moving unit, configured for moving vertexes of the mask pattern located in each annulus by a specific distance in a direction deviating from the mark hotspot and connecting the moved vertexes according to an original connection relationship to acquire an updated layout, wherein moving distances of the vertexes decrease as the numbers of rings of the annuli increase, and the specific distance does not exceed a tolerable deviation of a layout electrical design; and a verification unit, configured for verifying electrical characteristics of the updated layout, determining whether a deviation of the electrical characteristics of the updated layout is within a tolerable range, and performing geometric correction to compensate for a deviation of electrical parameters if no is determined and then ending correction, or ending the correction if yes is determined.

\* \* \* \* \*